(12) United States Patent
Watanabe et al.

(10) Patent No.: US 7,394,101 B2
(45) Date of Patent: *Jul. 1, 2008

(54) SEMICONDUCTOR DEVICE

(75) Inventors: Minoru Watanabe, Kanagawa-ken (JP); Noriyuki Kaifu, Tokyo (JP); Chiori Mochizuki, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/297,414

(22) Filed: Dec. 9, 2005

(65) Prior Publication Data

US 2006/0087577 A1   Apr. 27, 2006

Related U.S. Application Data

(62) Division of application No. 10/969,875, filed on Oct. 22, 2004, now Pat. No. 7,098,481, which is a division of application No. 10/305,981, filed on Nov. 29, 2002, now Pat. No. 6,909,116, which is a division of application No. 09/384,424, filed on Aug. 27, 1999, now Pat. No. 6,586,769.

(30) Foreign Application Priority Data

Aug. 31, 1998  (JP)  .................. 10-246151
Aug. 23, 1999  (JP)  .................. 11-235770

(51) Int. Cl.
*H01L 27/14* (2006.01)
*H01L 29/04* (2006.01)
*H01L 29/15* (2006.01)
*H01L 31/36* (2006.01)

(52) U.S. Cl. .................. 257/72; 257/291; 257/E27.133
(58) Field of Classification Search .................. 257/59, 257/347, 72
See application file for complete search history.

(56) References Cited

U.S. PATENT DOCUMENTS

| | | | |
|---|---|---|---|
| 5,428,300 A | 6/1995 | Takahashi et al. | 324/770 |
| 5,591,963 A | 1/1997 | Takeda et al. | 250/214.1 |
| 5,945,970 A | 8/1999 | Moon et al. | 345/92 |
| 6,081,305 A | 6/2000 | Sato et al. | 349/5 |
| 6,104,041 A | 8/2000 | Hsueh et al. | 257/59 |
| 6,259,497 B1 | 7/2001 | McDonnell et al. | 349/73 |
| 6,587,160 B2 | 7/2003 | Lee et al. | 349/40 |
| 6,639,414 B2 * | 10/2003 | Lien | 324/658 |
| 2001/0019130 A1 * | 9/2001 | Yamazaki et al. | 257/72 |

* cited by examiner

*Primary Examiner*—Evan Pert
*Assistant Examiner*—Ben P Sandvik
(74) *Attorney, Agent, or Firm*—Fitzpatrick, Cella, Harper & Scinto

(57) ABSTRACT

In a semiconductor device having a plurality of thin film transistors and matrix wiring lines formed on a substrate, the matrix wiring lines are electrically connected via resistors in order to prevent electrostatic destructions during a panel manufacture process and improve a manufacture yield.

5 Claims, 10 Drawing Sheets

SEMICONDUCTOR DEVICE

This application is a division of U.S. application Ser. No. 10/969,875, filed Oct. 22, 2004 now U.S. Pat. No. 7,098,481, which, in turn, is a division of application Ser. No. 10/305,981, filed Nov. 29, 2002 now U.S. Pat. No. 6,909,116, which, in turn is a division of application Ser. No. 09/384,424, filed Aug. 27, 1999, now U.S. Pat. No. 6,586,769 B1, the entire contents of which are incorporated herein by reference.

BACKGROUND OF THE INVENTION

1. Field of the Invention

The present invention relates to a semiconductor device, and more particularly to a semiconductor device suitable for a liquid crystal panel with TFTs and a photoelectric conversion apparatus.

2. Related Background Art

The size of a TFT panel is rapidly becoming large nowadays, under the circumstances of developments of manufacture techniques for TFT liquid crystal panels and wide applications of area sensors with photoelectric conversion elements such as X-ray image-pickup apparatuses. Together with a trend of large size panels, a pattern pitch is also becoming fine and a panel manufacture yield is lowering. The reasons for this may be ascribed to the following.

(1) As the size of a panel becomes large, a wiring distance per panel elongates and a wiring disconnection probability rises.

(2) As the pattern pitch becomes fine, the number of TFTs per panel and the area of wiring cross points per panel increases and a short circuit probability rises.

(3) Occurrent of electrostatic defects (ESD). As the size of a panel becomes large, a contact area with the panel increases so that the amount of static electricity to be caused by friction or peel-off increases and quick and uniform discharge of electricity is becoming more difficult. As the pattern pitch becomes fine, the number of pattern cross points increases and the probability of defective panels to be caused by ESD rises.

Of these reasons, the reason (3) of ESD can be effectively alleviated by connecting the common electrode bias line and gate lines, or the common electrode bias line and gate and transfer lines, to a metal line to maintain these lines at the same potential. However, these connected lines are required to be separated at an intermediate process of manufacturing a semiconductor device with a TFT panel. For example, this separation can be performed by a panel slicing process which uses a blade made of diamond grains solidified with resin. Since the metal lines are cut, some reliability problem may occur such as abnormal wiring to be caused by metal particles or chips, short circuit of metal lines to be caused by metal expansion, metal fatigue and corrosion to be caused by water or heat during the slicing.

SUMMARY OF THE INVENTION

It is an object of the present invention to provide a semiconductor device with a TFT matrix panel which can effectively prevent ESD during manufacture processes and improve a manufacture yield.

It is another object of the present invention to provide a semiconductor device which can omit a separation process to be executed by the slicing process by inserting a resistor having a desired resistance value between respective wiring lines, i.e., by interconnecting the lines by the resistor having a desired resistance value, and even if the separation process is necessary, it can be performed in the area where a metal wiring line is not formed.

It is another object of the present invention to provide a semiconductor device which can solve the problem associated with the separation process to be executed by the slicing process in the metal conductor avoid ESD.

It is another object of the present invention to provide a semiconductor device with a TFT matrix panel which can maintain the effects of preventing ESD until the panel is finally mounted on an apparatus, by electrically connecting wiring lines by resistors.

It is another object of the present invention to provide a semiconductor device having a plurality of thin film transistors and capacitors disposed on a substrate, wherein: a first electrode of each of the plurality of capacitors is connected to one of a source and a drain of each of the plurality of thin film transistors; a second electrode of each of the plurality of capacitors is connected to a common electrode bias line; a gate of each of the plurality of thin film transistors is connected to a corresponding one of a plurality of gate lines; the other of the source and the drain of each of the plurality of thin film transistors is connected to a corresponding one of a plurality of transfer lines; and the common electrode bias line, the plurality of gate lines and the plurality of transfer lines are electrically connected.

It is another object of the present invention to provide a semiconductor device having a plurality of thin film transistors and capacitors disposed on a substrate, wherein: a first electrode of each of the plurality of capacitors is connected to one of a source and a drain of each of the plurality of thin film transistors; a second electrode of each of the plurality of capacitors is connected to common electrode bias lines; a gate of each of the plurality of thin film transistors is connected to a corresponding one of a plurality of gate lines; and the common electrode bias lines and the plurality of gate lines are electrically connected.

It is another object of the present invention to provide a semiconductor device having a plurality of thin film transistors and associated wiring lines formed on a substrate, wherein the wiring lines are disposed vertically and horizontally crossing each other, the wiring lines are electrically insulated at each cross point and the wiring lines are connected via resistors.

According to the semiconductor device of the invention, the common electrode bias line and the plurality of gate lines are electrically connected, or the common electrode bias line, the plurality of gate lines and the plurality of transfer lines are electrically connected. Since the common electrode bias line and the plurality of gate lines, or the common electrode bias line, the plurality of gate lines and the plurality of transfer lines are electrically connected, they can be maintained at the same potential. Therefore, ESD of each line connected, to be caused by static electricity during panel manufacture, can be prevented and a manufacture yield can be improved.

Also according to the semiconductor device of the invention, since lines are interconnected by the resistor having a desired resistance value, a slicing process is not necessarily required, and even if the slicing process is necessary, it can be performed along the semiconductor layer so that the above-described reliability problem can be solved.

DETAILED DESCRIPTION OF THE PREFERRED EMBODIMENTS

Embodiments of the invention will be described with reference to the accompanying drawings.

First Embodiment

Figure 1:
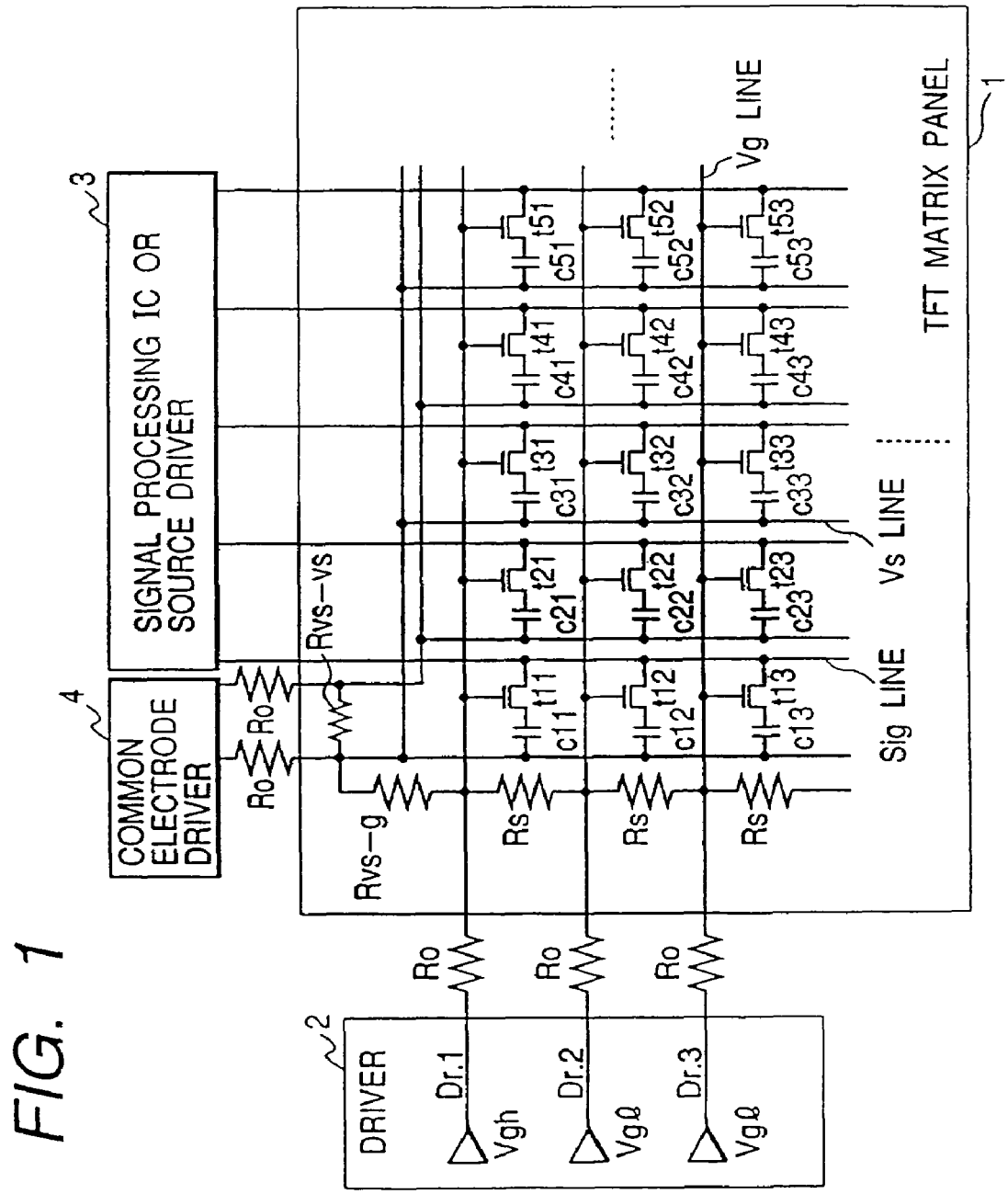
FIGS. 1, 4 and 8 are simplified equivalent circuits illustrating examples of a semiconductor device of this invention.
Figure 2:
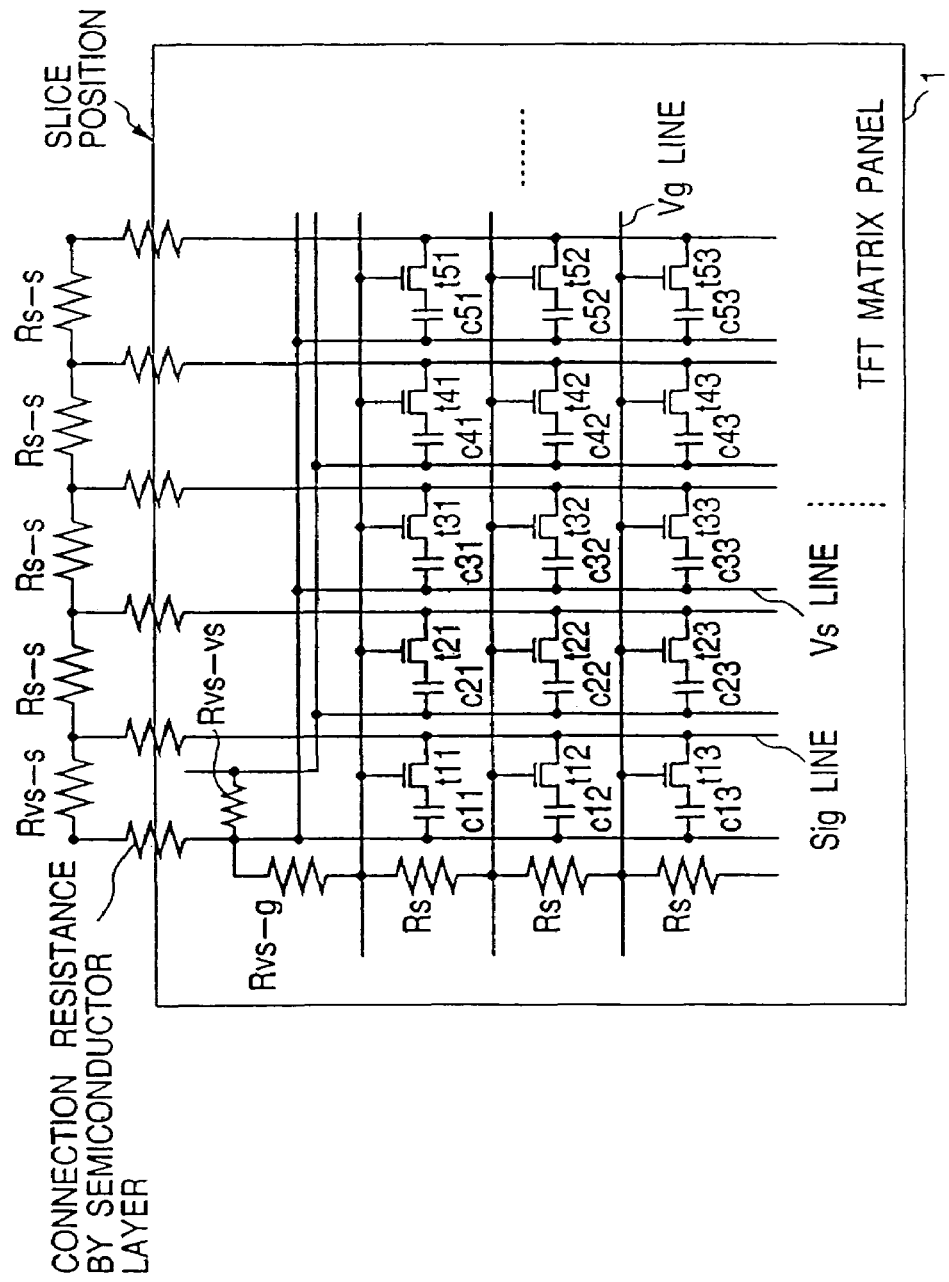
FIGS. 2, 5, 9, 10 and 11 are schematic plan views illustrating examples of the semiconductor device of this invention.

A first embodiment of the invention will be described with reference to the accompanying drawings. FIG. 1 is a simplified equivalent circuit of a semiconductor device according to the first embodiment of the invention, and FIG. 2 is a schematic plan view of the semiconductor device of the first embodiment showing a slice area of the semiconductor device before the device is sliced and its simplified equivalent circuit.

As shown in FIG. 1, the semiconductor device of this embodiment includes a TFT matrix panel 1 sliced, a driver unit 2, a signal processing IC or source driver 3 and a common electrode driver 4. c11, c12, . . . represent capacitors which show a separation state of electrons and holes generated by unrepresented photoelectric conversion elements upon application of a bias voltage. t11, t12, . . . represent TFTs which function as switches for transferring electric charges generated by photoelectric conversion elements.

The photoelectric conversion element area includes: for example, a lower electrode layer formed by depositing aluminum, chrome or the like on an insulating substrate through vacuum deposition or the like; an insulating layer made of silicon nitride or silicon oxide for intercepting a pass of both electrons and holes; a semiconductor layer made of intrinsic semiconductor of amorphous silicon hydride; a diffusion preventing layer made of $n^+$-type amorphous silicon for preventing a diffusion of holes; and an insulating layer formed by depositing aluminum through vapor deposition or the like, respectively stacked sequentially in this order on the insulating substrate.

Two series of common electrode bias lines $V_S$ are provided and a resistor $R_{VS-VS}$ is connected between the two series. A resistor Rs is connected between adjacent gate lines Vg, and a resistor $R_{VS-g}$ is connected between the common electrode bias line Vs and gate line Vg.

If the first gate line Vg of the first line is to be selected, an on-voltage Vgh of TFTs (t11, t21, t31, . . . ) is applied to a driver Dr. 1 of the driver unit 2 and an off-voltage Vgl of TFTs is applied to the drivers Dr. 2 and Dr. 3 of the driver unit 2. A resistor Ro is connected between each of the drivers Dr. 1 to Dr. 3 and a corresponding one of the first TFTs (t11, t12, t13, . . . ), and the resistor Rs made of a semiconductor layer is connected between adjacent gate lines Vg. The value of the resistor Rs is set so that a voltage applied to the gate electrode of the first TFT (t12) for the driver Dr. 2 becomes lower than Vth which is a threshold voltage of TFT. If the value of the resistor Rs is set in this manner, TFTs of the lines other than the first gate line Vg will not turn on.

Figure 3A:
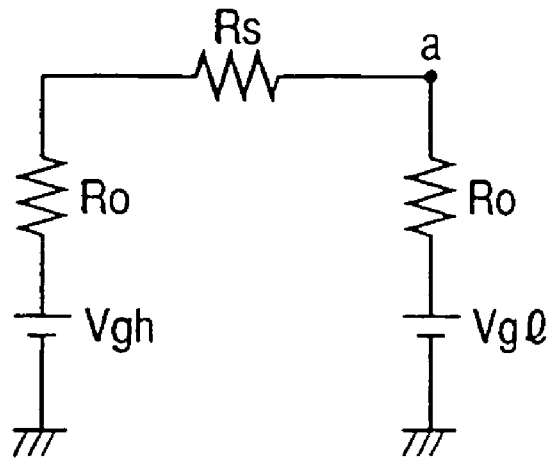
FIGS. 3A and 3B are equivalent circuits illustrating operation examples of the semiconductor device.

Calculating the value of the resistor Rs made of a semiconductor layer will be described in the following. It is assumed that the on-voltage Vgh of TFTs (t11, t21, t31, . . . ) is applied to the driver Dr. 1 of the driver unit 2, and the off-voltage Vgl is applied to the other drivers. The equivalent circuit of the first and second gate lines Vg is shown in FIG. 3A. The potential Va at point a is given by:

$$Va = Vgl + (Vgh - Vgl) \cdot Ro/(Rs + 2Ro)$$

Figure 3B:
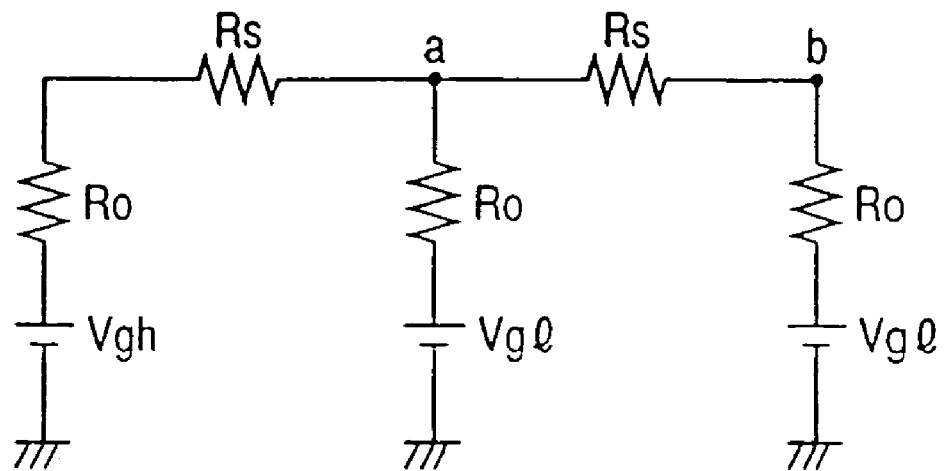

The equivalent circuit of the first to third gate lines Vg is shown in FIG. 3B. The potential Va' at point a is given by:

$$Va' = Vgl + (Vgh - Vgl) \cdot R/(Rs + Ro + R)$$

where R=Ro(Rs+Ro)/(Rs+2Ro).

Since Va−Va'=(Vgh−Vgl)·Ro/(Rs+2Ro)−(Vgh−Vgl)·R/(Rs+Ro+R)>0, Va>Va'. Considering gate line Vg line for the first to n-th lines, the voltage at point a shown in FIG. 3A lowers as the number n of gate lines increases. The potential at each gate line Vg is lower than that at the preceding gate line (e.g., a potential Vb at point b in FIG. 3B is lower than Va'). Therefore, if the value of the resistor Rs is set to satisfy Va<Vth, the voltage at the second and following gate lines Vg becomes lower than Vth irrespective of the number of gate lines Vg. Namely, the value of the resistor Rs is set to satisfy:

$$Vgl + (Vgh - Vgl) \cdot Ro/(Rs + 2Ro) < Vth, \text{ or}$$

$$Rs > (Vgl + Vgh - 2Vth) \cdot Ro/(Vth - Vgl)$$

By setting the value of the resistor Rs in this manner, each gate line Vg can be reliably selected and controlled. For example, if the on-voltage is applied to the driver Dr. 1, and the off-voltage is applied to the other drivers Dr. 2, Dr. 3, . . . , all TFTs connected to these drivers Dr. 2, Dr. 3, . . . are maintained off because of the gate electrode potentials lower than Vth.

In this embodiment, assuming that Vgl≅−5 V, Vgh≅15 V, Vth≅2 V, and Ro≅100Ω, the value of the resistor Rs is set to satisfy:

$$Rs > 85.7 \Omega.$$

The value of the resistor Rs is preferably set to about 1 MΩ, taking a variation and margin in manufacture processes into consideration.

The range of the value of the resistor $R_{VS-g}$ is determined as in the following.

A common electrode bias (storage bias) at the bias line Vs is 9 V during an operation of storing electrons or holes generated by light absorption in the semiconductor, whereas a refresh bias (erase bias) is 3 V during an operation of draining stored electrons or holes. Therefore, a maximum difference between the gate line (Vgh=15 V, Vgl=−5 V) and bias line Vs is 14 V which is smaller than a bias difference (Vgh−Vgl=20 V) between bias lines Vs. If the value of the resistor $R_{VS-g}$ between the bias application point of the gate line Vg and the bias application point of the gate line Vg is set larger than the value of the resistors Rs+Ro, TFTs can be driven reliably. For example, if the on-voltage Vgh is applied to TFTs at the gate line connected to the resistor $R_{VS-g}$, these TFTs are turned on, whereas if the off-voltage Vgl is applied to the TFTs, they are turned off because the off-voltage is lower than the threshold voltage. Namely, when the driving voltages on the gate line are taken into consideration, as a countermeasure for ESD, the value of the resistor $R_{VS-g}$ is set to satisfy:

$$R_{VS-g} > Rs$$

In this state, the semiconductor device operates in a normal state.

It has been confirmed that TFTs can be driven in a normal state without ESD if a bias variation at the bias line is in a range smaller than 1% of a bias difference between the gate line Vg and bias line Vs. Therefore, the value of the resistor $R_{VS\text{-}g}$ is set to satisfy:

$$R_{VS\text{-}g} > 100 \times Ro$$

If the value is set in this manner, it is possible to suppress the bias variation smaller than about 1% and drive TFTs in a normal state.

From the above considerations, it is preferable to set the value of the resistor $R_{VS\text{-}g}$ to satisfy both:

$$R_{VS\text{-}g} > Rs \text{ and } R_{VS\text{-}g} > 100 \times Ro$$

In the example described above, the value is set to satisfy:

$$R_{VS\text{-}g} > 10 \text{ k}\Omega$$

With respect to the value of the resistor $R_{VS\text{-}VS}$, similarly, TFTs can be driven in a normal state if a bias variation is in a range smaller than 1% of a bias difference between two independent series of the bias lines Vs. Therefore, the value of the resistor $R_{VS\text{-}VS}$ is set to satisfy:

$$R_{VS\text{-}VS} > 100 \times Ro$$

In the example described above, the value is set to satisfy:

$$R_{VS\text{-}VS} > 10 \text{ k}\Omega$$

The value of the resistor $R_{VS\text{-}g}$ and $R_{VS\text{-}VS}$ are preferably set to about 10 M$\Omega$ which is sufficiently high for satisfying the above-described formulas, taking a variation and margin in manufacture processes into consideration. With the above-described settings, each series of the bias lines and each gate line can be controlled reliably.

ESD of a panel, to be caused by an electrostatic charge potential difference between each series of the common electrode bias line Vs and gate line Vg during the panel manufacture processes after the panel is sliced, can be avoided and the manufacture yield can be improved.

FIG. 2 is an equivalent circuit of a TFT matrix panel before a slicing process, according to the first embodiment.

Two series of the common electrode bias lines Vs are connected by the resistor $R_{VS\text{-}VS}$. The resistor Rs is connected between adjacent gate lines Vg, a resistor $R_{S\text{-}S}$ is connected between adjacent transfer lines Sig, and the resistor $R_{VS\text{-}g}$ is connected between the common electrode bias line Vs and gate line Vg. Therefore, all the gate lines Vg, bias lines Vs and transfer lines of the TFT panel are electrically connected and maintained always at the same potential. Therefore, ESD of the panel, to be caused by an electrostatic charge potential difference between wiring lines during the panel manufacture processes, can be avoided and the manufacture yield can be improved.

The transfer lines Sig for transferring charges generated by photoelectric conversion elements are interconnected by semiconductor layers until the panel slice process is executed, and each line is separated after the panel is sliced.

Second Embodiment

Figure 4:
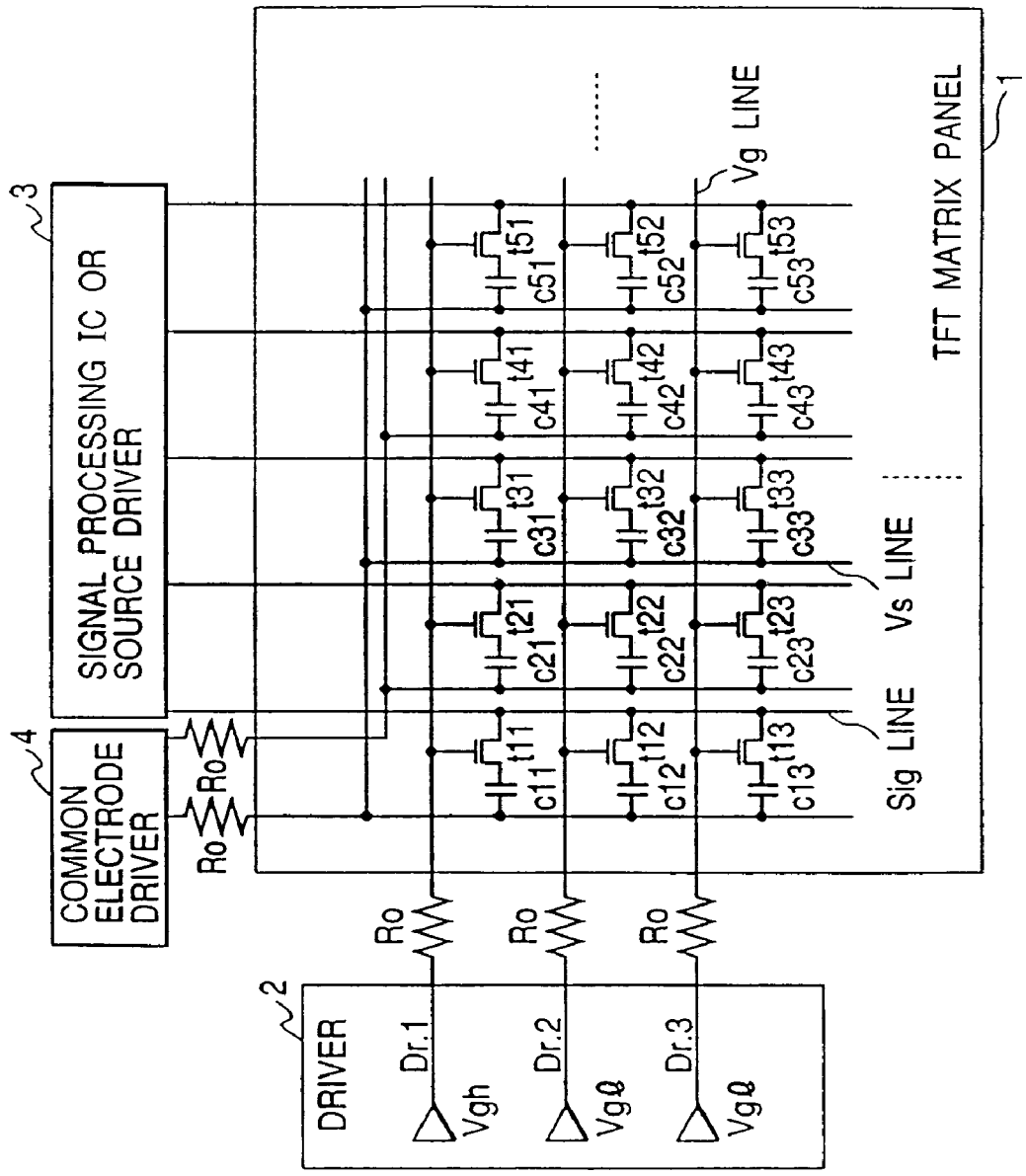

A second embodiment of the invention will be described with reference to the accompanying drawings. FIG. 4 is a simplified equivalent circuit of a semiconductor device according to the second embodiment of the invention, and FIG. 5 is a schematic plan view of the semiconductor device of the second embodiment showing a slice area of the semiconductor device before a slicing process and its simplified equivalent circuit.

As shown in FIG. 4, the semiconductor device of this embodiment includes a TFT matrix panel 1 sliced, a driver unit 2, a signal processing IC or source driver 3 and a common electrode driver 4. c11, c12, ... represent capacitors which show a liquid crystal portion. t11, t12, ... represent TFTs which function as switches to be used when an electric field is applied to liquid crystal from the source driver 3. Two series of common electrode bias lines Vs are provided which are electrically separated. All gate lines Vg, bias lines Vs and transfer lines Sig are also electrically separated.

Figure 5:
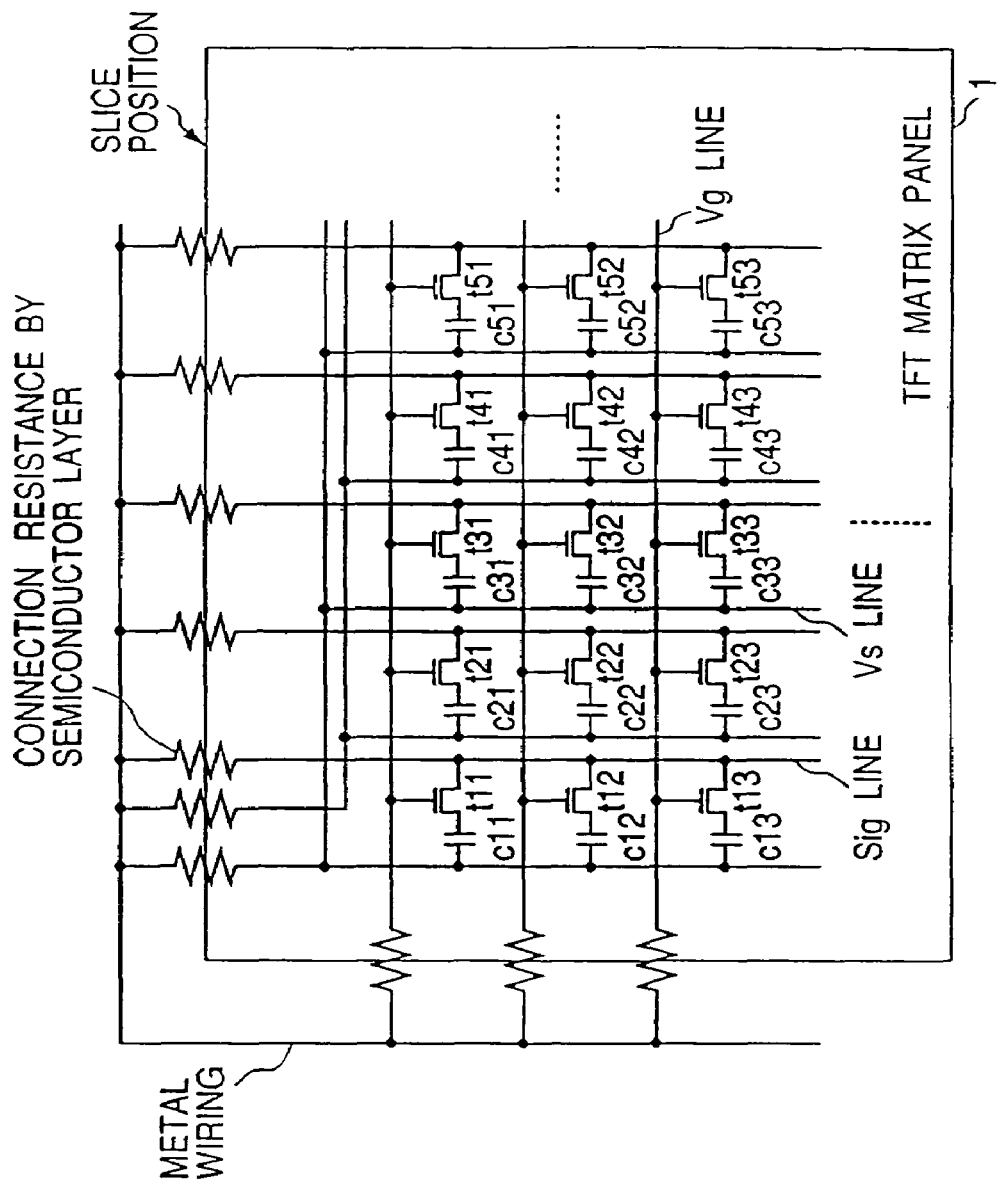

FIG. 5 is an equivalent circuit of the TFT matrix panel of the second embodiment before it is sliced.

The common electrode bias lines are controlled as two series. In each series, the common electrode bias line Vs, gate line Vg and transfer line Sig are connected to respective semiconductor layers. The semiconductor layers are connected to a metal wiring disposed in an area outside of the area in which display elements including TFTs and capacitors are formed.

Figure 6:
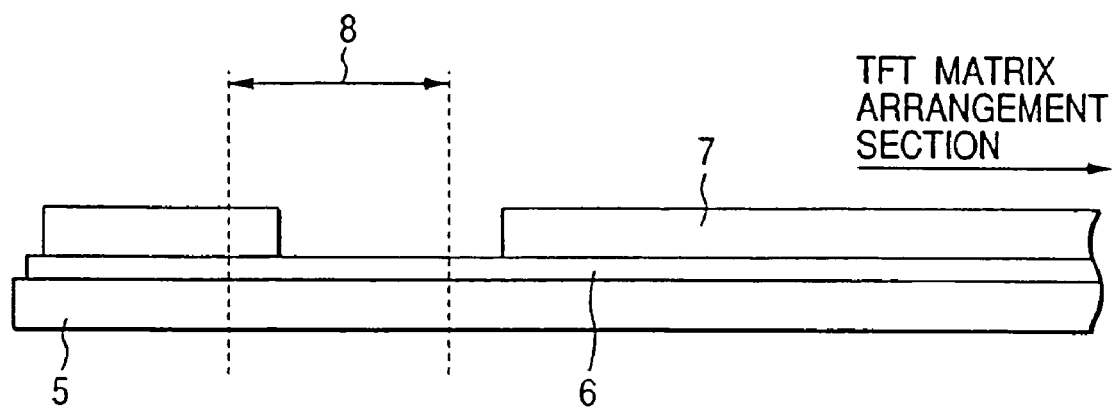
FIGS. 6 and 7 are schematic cross sectional views showing examples of a slice area.

FIG. 6 is a schematic cross sectional view showing an example of a panel slicing area. A TFT matrix arrangement section of a panel having a semiconductor layer 6 and a metal wiring 7 formed on an insulating substrate 5, is sliced at a semiconductor layer portion along a slicing area 8. At the respective semiconductor layers connected to the bias line, gate line Vg and transfer line Sig of each series shown in FIG. 5, the panel is sliced along the slicing area 8, as shown in FIG. 6.

Figure 7:
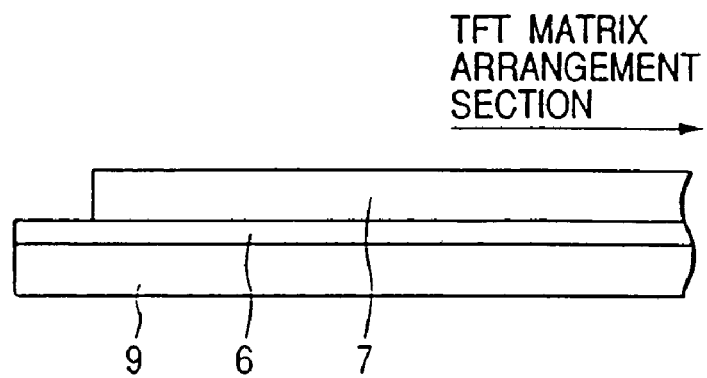

FIG. 7 is a cross sectional view of the sliced portion of the panel after it is sliced. The TFT matrix arrangement section is sliced at the semiconductor layer portion. Reference numeral 9 represents a sliced edge.

Third Embodiment

Figure 8:
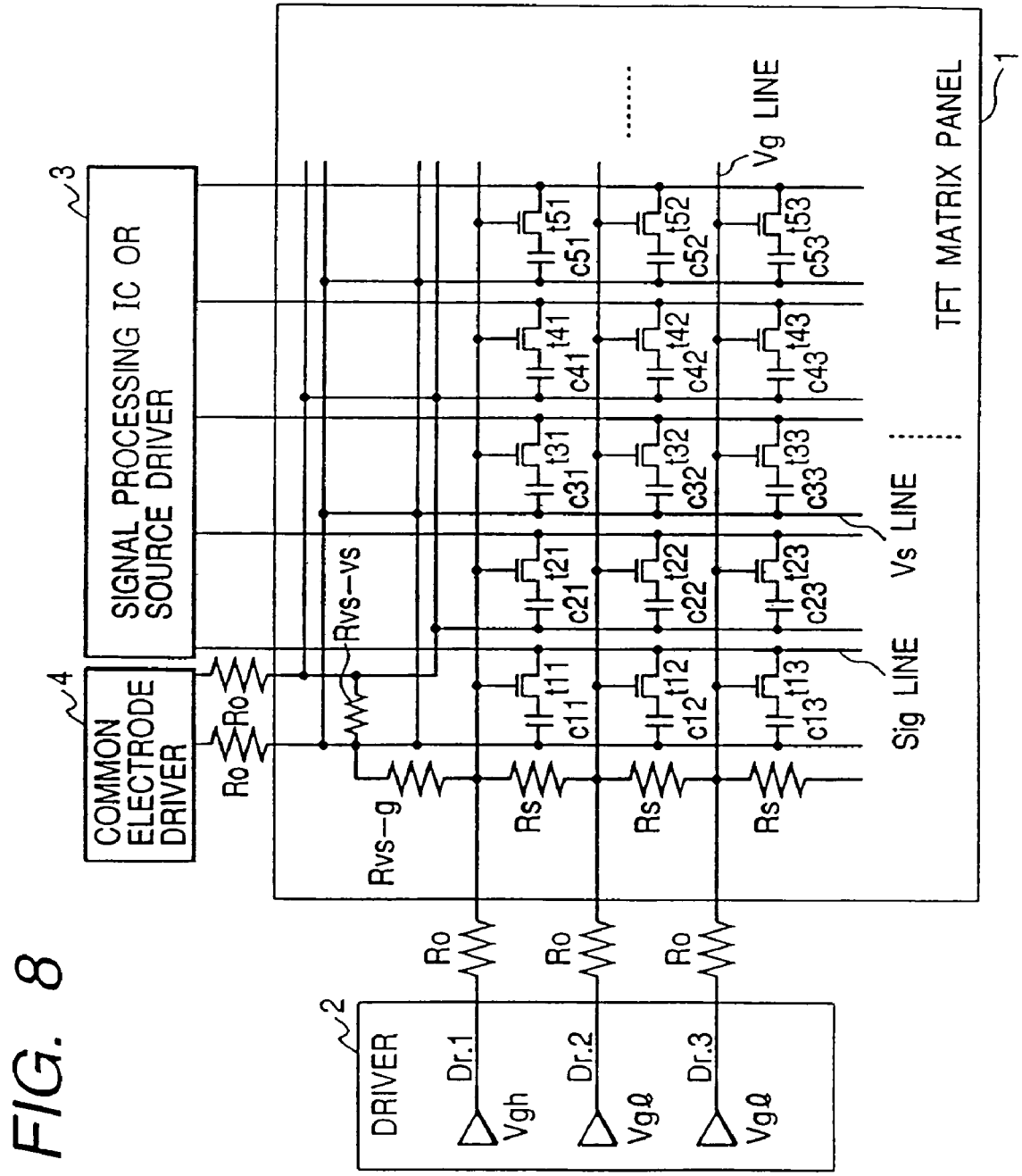

The third embodiment of the invention will be described with reference to the accompanying drawing. FIG. 8 is an simplified equivalent circuit of a semiconductor device according to the third embodiment of the present invention.

As shown in FIG. 8, the semiconductor device of this embodiment includes a TFT matrix panel 1 sliced, a driver unit 2, a signal processing IC or source driver 3 and a common electrode driver 4. c11, c12, ... represent capacitors which show a separation state of electrons and holes generated by unrepresented photoelectric conversion elements upon application of a bias voltage. t11, t12, ... represent TFTs which function as switches for transferring electric charges generated by photoelectric conversion elements.

Two series of common electrode bias lines $V_S$ are provided and supply vias voltages via a plurality of wiring lines in order to lower a wiring resistance of each series of the common electrode bias line $V_S$. A resistor $R_{VS\text{-}VS}$ is connected between the two series. A resistor Rs is connected between adjacent gate lines Vg, and a resistor $R_{VS\text{-}g}$ is connected between the common electrode bias line Vs and gate line Vg.

If the first gate line Vg of the first line is to be selected, an on-voltage Vgh of TFTs (t11, t21, t31, ...) is applied to a driver Dr. 1 of the driver unit 2 and an off-voltage Vgl of TFTs is applied to the drivers Dr. 2 and Dr. 3 of the driver unit 2. A resistor Ro is connected between each of the drivers Dr. 1 to Dr. 3 and a corresponding one of the first TFTs (t11, t12, t13, ...), and the resistor Rs made of a semiconductor layer is connected between adjacent gate lines Vg. The value of the resistor Rs is set so that a voltage applied to the gate electrode of the first TFT (t12) for the driver Dr. 2 becomes lower than Vth which is a threshold voltage of TFT.

As described with the first embodiment, the value of the resistor Rs made of a semiconductor layer is given by:

$$Vgl + (Vgh - Vgl) \cdot Ro/(Rs + 2Ro) < Vth, \text{ or}$$

$$Rs > (Vgl + Vgh - 2Vth) \cdot Ro/(Vth - Vgl)$$

By setting the value of the resistor Rs in this manner, each gate line Vg can be reliably selected and controlled. For example, if the on-voltage is applied to the driver Dr. 1, and the off-voltage is applied to the other drivers Dr. 2, Dr.

3, . . . , all TFTs connected to these drivers Dr. 2, Dr. 3, . . . are maintained off because of the gate electrode potentials lower than Vth.

In this embodiment, assuming that Vgl≅−5 V, Vgh≅15 V, Vth≅2 V, and Ro≅100Ω, the value of the resistor Rs is set to 1 MΩ which satisfies:

$$Rs > 85.7 \Omega.$$

The range of the value of the resistor $R_{VS-g}$ is determined as in the following.

A common electrode bias (storage bias) at the bias line Vs is 9 V during an operation of storing electrons or holes to be transferred, whereas a refresh bias (erase bias) is 3 V during an operation of draining stored electrons or holes after the transfer. Therefore, a maximum difference between the gate line (Vgh=15 V, Vgl=−5 V) and bias line Vs is 14 V which is smaller than a bias difference (Vgh−Vgl=20 V) between bias lines Vs. If the value of the resistor $R_{VS-g}$ between the bias application point of the gate line Vg and the bias application point of the gate line Vg is set larger than the value of the resistors Rs+Ro, TFTs can be driven reliably. For example, if the on-voltage Vgh is applied to TFTs at the gate line connected to the resistor $R_{VS-g}$, these TFTs are turned on, whereas if the off-voltage Vgl is applied to the TFTs, they are turned off because the off-voltage is lower than the threshold voltage. Namely, when the driving voltages on the gate line are taken into consideration, as a countermeasure for ESD, the value of the resistor $R_{VS-g}$ is set to satisfy:

$$R_{VS-g} > Rs$$

In this state, the semiconductor device operates in a normal state.

It has been confirmed that TFTs can be driven in a normal state without ESD if a bias variation at the bias line is in a range smaller than 1% of a bias difference between the gate line Vg and bias line Vs. Therefore, the value of the resistor $R_{VS-g}$ is set to satisfy:

$$R_{VS-g} > 100 \times Ro$$

If the value is set in this manner, it is possible to suppress the bias variation smaller than about 1% and drive TFTs in a normal state.

From the above considerations, it is preferable to set the value of the resistor $R_{VS-g}$ to satisfy both:

$$R_{VS-g} > Rs \text{ and } R_{VS-g} > 100 \times Ro$$

With respect to the value of the resistor $R_{VS-VS}$, similarly, TFTs can be driven in a normal state if a bias variation is in a range smaller than 1% of a bias difference between two independent series of the bias lines Vs. Therefore, the value of the resistor $R_{VS-VS}$ is set to satisfy:

$$R_{VS-VS} > 100 \times Ro$$

The values of the resistors $R_{VS-g}$ and $R_{VS-VS}$ are preferably set to about 10 MΩ which is sufficiently high for satisfying the above-described formulas, taking a variation and margin in manufacture processes into consideration. With the above-described settings, each series of the bias lines and each gate line can be controlled reliably.

ESD of a panel, to be caused by an electrostatic charge potential difference between each series of the common electrode bias line Vs and gate line Vg during the panel manufacture processes after the panel is sliced, can be avoided and the manufacture yield can be improved.

Fourth Embodiment

Figure 9:
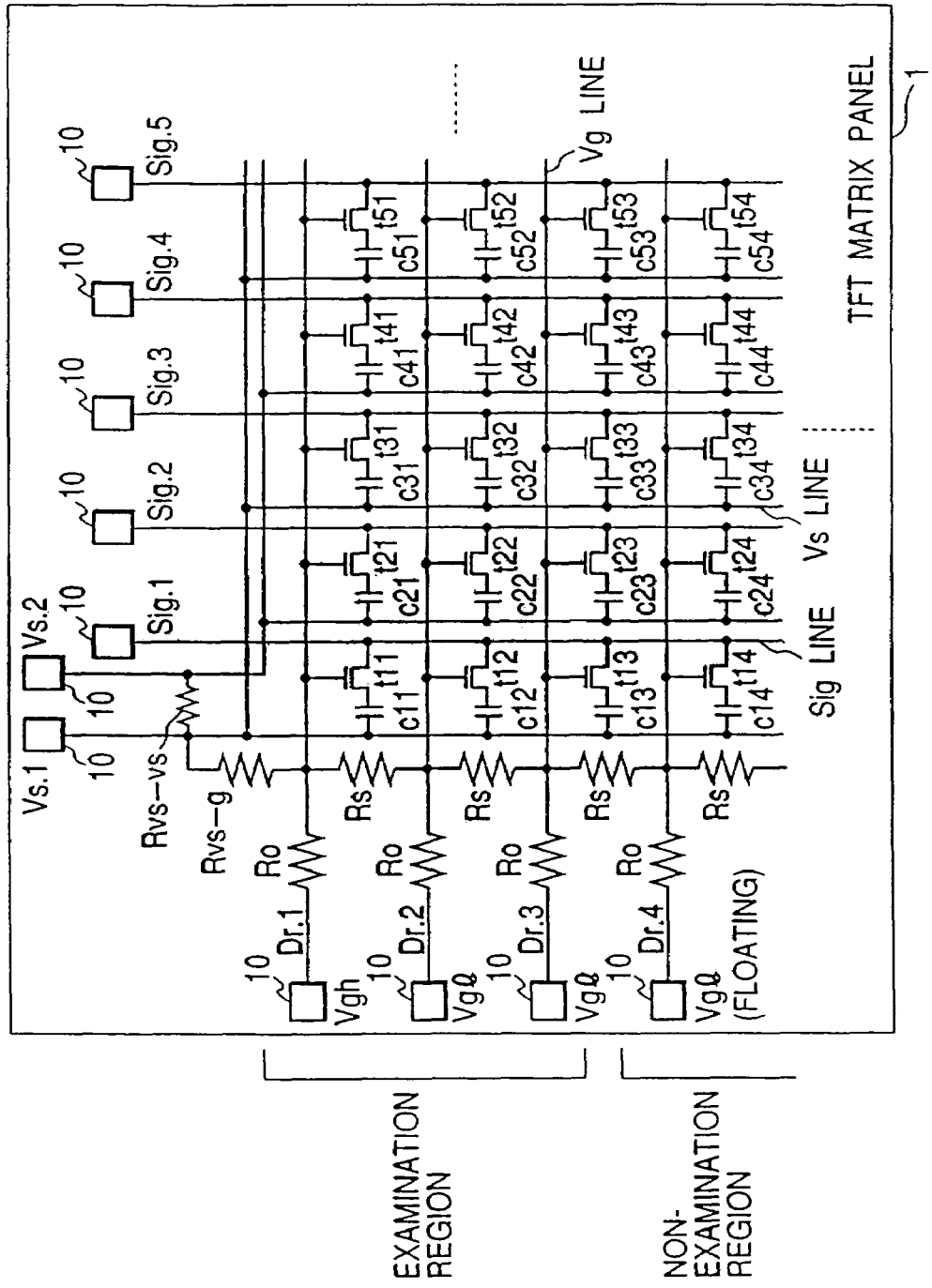

The fourth embodiment of the invention will be described with reference to the accompanying drawings. FIG. 9 is a simplified equivalent circuit of a semiconductor device according to the fourth embodiment of the present invention.

In FIG. 9, c11, c12, . . . represent capacitors which show a separation state of electrons and holes generated by unrepresented photoelectric conversion elements upon application of a bias voltage. t11, t12, . . . represent TFTs which function as switches for transferring electric charges generated by photoelectric conversion elements.

Two series of common electrode bias lines $V_S$ are provided. A resistor $R_{VS-VS}$ is connected between the two series. A resistor Rs is connected between adjacent gate lines Vg, and a resistor $R_{VS-g}$ is connected between the common electrode bias line Vs and gate line Vg.

Each wiring is provided with an inspection pad 10 to which a bias voltage is applied from a probe or the like during a panel inspection process to judge before a final manufacture process whether the semiconductor device is defective or not.

If the first gate line Vg of the first line is to be selected, an on-voltage Vgh of TFTs (t11, t21, t31, . . . ) is applied to Dr. 1 from the inspection pad 10, and an off-voltage Vgl of TFTs is applied to Dr. 2 and Dr. 3 from the inspection pads 10. A resistor Ro is connected between each of the inspection pads and a corresponding one of the first TFTs (t11, t12, t13, . . . ), and the resistor Rs made of a semiconductor layer is connected between adjacent gate lines Vg. The value of the resistor Rs is set so that a voltage applied to the gate electrode of the first TFT (t12) for Dr. 2 becomes-lower than Vth which is a threshold voltage of TFT. In this embodiment, the value of the resistor $R_S$ is set to 1 MΩ.

The value of the resistor $R_{VS-g}$ is determined to satisfy:

$$R_{VS-g} > R_S$$

by taking into consideration a bias difference between gate and bias lines Vg−Vs and a bias difference between on-and off-voltage Vgh−Vgl. In this state, the semiconductor device operates in a normal state.

It has been confirmed that TFTs can be driven in a normal state without ESD if a bias variation at the bias line Vs is in a range smaller than 1% of a bias difference between the gate line Vg and bias line Vs. Therefore, the value of the resistor $R_{VS-g}$ is set to satisfy:

$$R_{VS-g} > 100 \times Ro$$

If the value is set in this manner, it is possible to suppress the bias variation smaller than about 1% and drive TFTs in a normal state.

From the above considerations, it is preferable to set the value of the resistor $R_{VS-g}$ to satisfy both:

$$R_{VS-g} > Rs \text{ and } R_{VS-g} > 100 \times Ro$$

Similarly, the value of the resistor $R_{VS-VS}$ is set to satisfy:

$$R_{VS-VS} > 100 \times Ro$$

In this embodiment, the values of the resistors $R_{VS-g}$ and $R_{VS-VS}$ are preferably set to about 10 MΩ which is sufficiently high for satisfying the above-described formulas. With this setting, each series of the bias lines and each gate line can be controlled reliably.

In inspecting the panel with inspection pads, if it is difficult to measure all pads at the same time, the panel is divided into a plurality of blocks and each block is measured to inspect the whole panel. In such a case, the following problem may occur.

Figure 10:
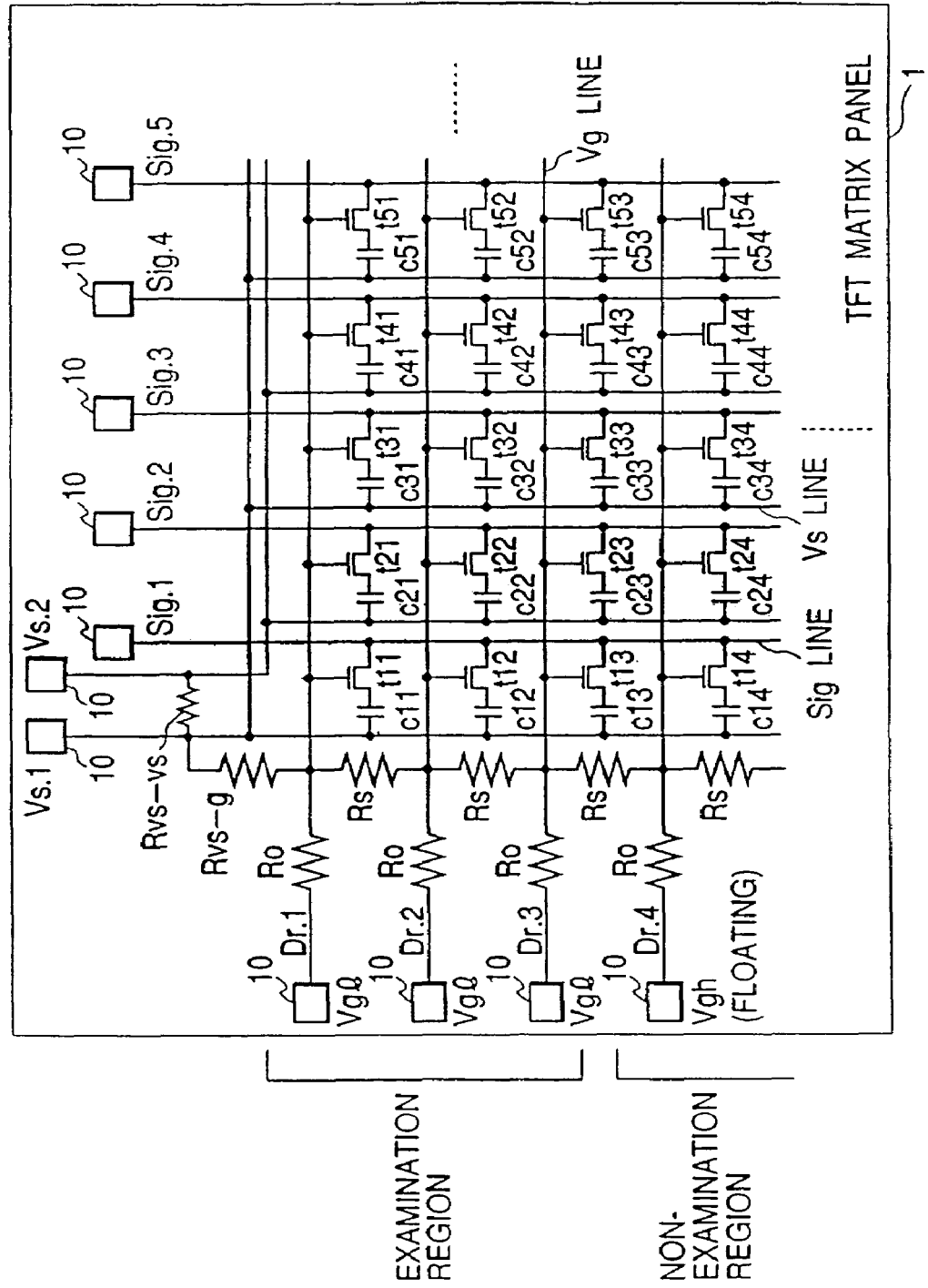

As shown in FIG. 9, if a TFT on-voltage Vgh is applied to Dr. 1 in an inspection or examination region Dr. 1 to Dr. 3 and a TFT off-voltage Vgl is applied to Dr. 2, the gate lines Vg for Dr. 4 to following Dr's in a non-inspection or non-examination region take an electrically floating potential which is determined by a leak current from Dr. 3. Therefore, the gate lines Vg for Dr. 4 to following Dr's take a TFT off-voltage. However, as showing in a schematic circuit diagram shown in FIG. 10, if a TFT off-voltage Vgl is applied to Dr. 1 and Dr. 2 and a TFT on-voltage Vgh is applied to Dr. 3, the gate lines Vg for Dr. 4 to following Dr's take an electrically floating potential determined by a leak current from Dr. 3, which potential may be the TFT on-voltage so that the photoelectric conversion elements connected to Dr. 3 cannot be inspected. Namely, a voltage at the remote end of the examination region leaked to the non-examination region may cause photoelectric conversion elements not to be evaluated.

Figure 11:
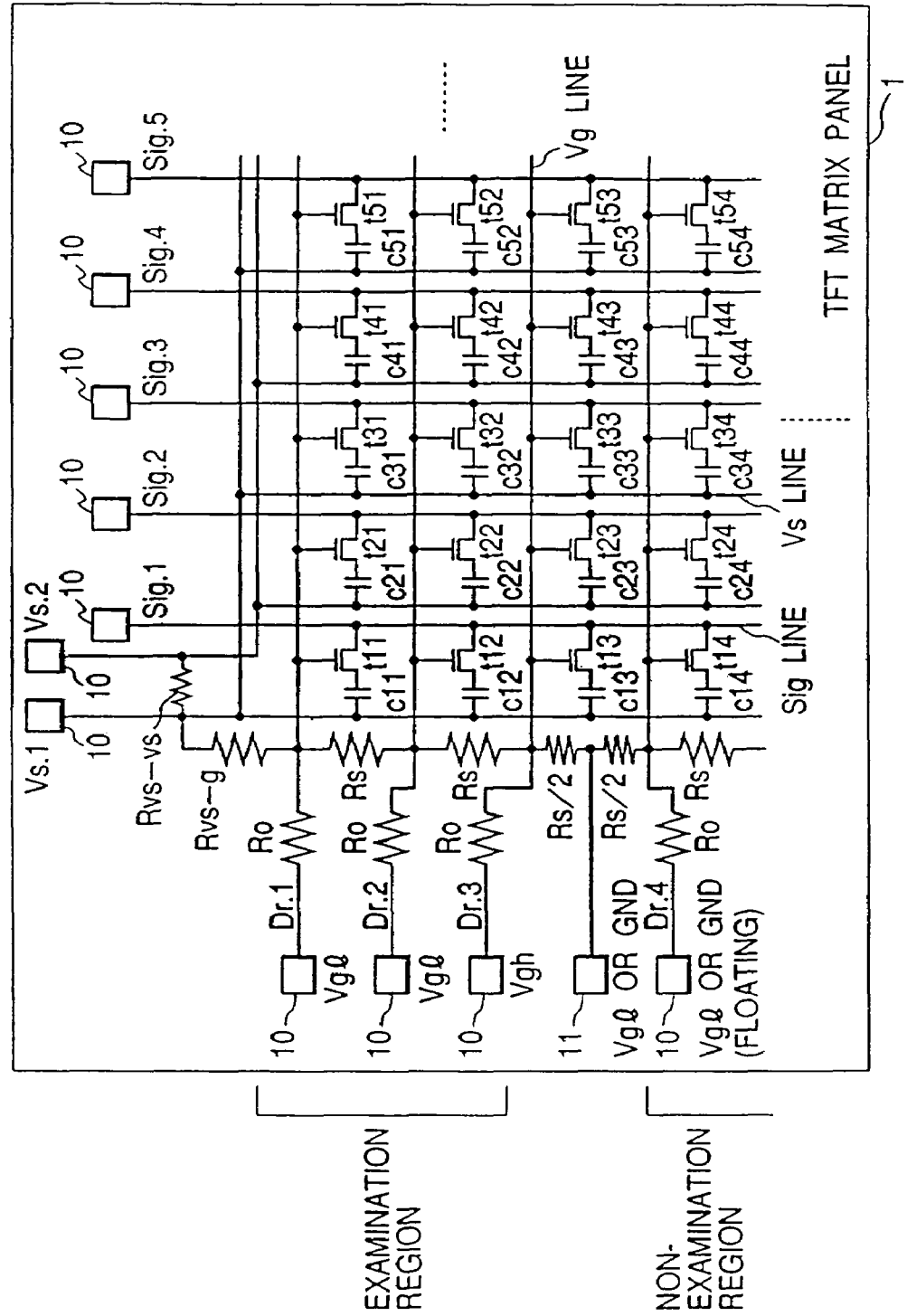

In the fourth embodiment, as shown in the schematic circuit diagram of FIG. 11, a dummy pad 11 capable of always supplying a Vgl or ground potential from a probe is provided at the boundary area between the examination region and non-examination region. A leak current from this dummy pad 11 is used for controlling the potential at the gate lines Vg in the non-examination region to be the Vgl or ground potential and maintain TFTs in the non-examination region at the TFT off-voltage. Accordingly, even in a per-block inspection, a leak current of the wiring having the resistance Rs provided for ESD countermeasure does not pose a problem and the inspection can be performed.

ESD of a panel, to be caused by an electrostatic charge potential difference between each series of the common electrode bias line Vs and gate line Vg during the panel manufacture processes after the panel is sliced, can be avoided and the manufacture yield can be improved. Furthermore, the problem specific to the inspection process can be solved.

As described so far, according to the present invention, a semiconductor device with a TFT matrix panel is provided which can effectively prevent ESD during manufacture processes and improve a manufacture yield.

According to the present invention, a resistor having a desired resistance value is inserted between respective wiring lines. Since lines are interconnected by the resistor having a desired resistance value, a separation process to be executed by the slicing process is not necessarily required, and even if the separation process is necessary, it can be performed in the area where a metal wiring line is not formed. A problem associated with the separation process to be executed by the slicing process in the metal conductor area does not occur and ESD can be avoided.

Furthermore, according to the present invention, since wiring lines are electrically connected by resistors, the effects of preventing ESD can be maintained until the panel is finally mounted on an apparatus.

The invention is not limited only to the above embodiments, but various modifications and combinations are possible without departing from the scope of the appended claims.

What is claimed is:

1. A photoelectric conversion device comprising:
a plurality of thin film transistors disposed on an insulating substrate;
a plurality of capacitors disposed on the insulating substrate, each capacitor having a first electrode connected to one of a source and a drain of said thin film transistors;
a common electrode bias line connected to a second electrode of said capacitors for applying a bias for separating electrons and holes generated by photoelectric conversion;
a plurality of gate lines which are connected to gate electrodes of said thin film transistors; and
a plurality of transfer lines connected to another of the sources and drains of said thin film transistors for transferring electric charge generated by the photoelectric conversion,
wherein the common electrode bias line is connected electrically to the gates lines through a first resistor, and connected electrically to the transfer lines through a second resistor.

2. A photoelectric conversion device according to claim 1, wherein there are a plurality of said common electrode bias lines arranged in plural sets which are mutually and electrically connected through a resistor.

3. A photoelectric conversion device according to claim 1, wherein said first resistor and second resistor are formed by a semiconductor layer.

4. A photoelectric conversion device according to claim 3, wherein a value Rs of a connection resistance provided by the semiconductor layer between the gate lines is set to satisfy:

$$Rs>(Vg1+Vgh-2Vth)Ro/(Vth-Vg1)$$

where Vgh is the on-voltage of gate electrode of each thin film transistor, Vth is the threshold voltage of each thin film transistor, and Ro is the value of the connection resistance between gate driver and the gate line of the thin film transistor and between the common electrode bias driver and the common electrode line.

5. A photoelectric conversion device according to claim 4, wherein each said common electrode bias line belongs to one of two or more separately driven groups, a semiconductor layer is formed between said groups, and a value Rvs-vs of a connection resistance provided by the semiconductor layer is set to satisfy:

$$Rvs\text{-}vs>100Ro.$$

* * * * *

UNITED STATES PATENT AND TRADEMARK OFFICE
CERTIFICATE OF CORRECTION

| | | |
|---|---|---|
| PATENT NO. | : 7,394,101 B2 | Page 1 of 2 |
| APPLICATION NO. | : 11/297414 | |
| DATED | : July 1, 2008 | |
| INVENTOR(S) | : Minoru Watanabe et al. | |

It is certified that error appears in the above-identified patent and that said Letters Patent is hereby corrected as shown below:

<u>COLUMN 1</u>:

Line 33, "Occurrent" should read --Occurrence--.

<u>COLUMN 2</u>:

Line 7, "conductor avoid" should read --conductor to avoid--.

<u>COLUMN 3</u>:

Line 60, "of" (first occurrence) should read --of the--.

<u>COLUMN 4</u>:

Line 51, "bias application point of the gate line Vg is set" should read --bias line Vs is set--.

<u>COLUMN 6</u>:

Line 42, "vias" should read --bias--; and
Line 57, "of" should read --of the--.

<u>COLUMN 7</u>:

Line 21, "gate line Vg" should read --bias line Vs--.

<u>COLUMN 8</u>:

Line 31, "becomes-lower" should read --becomes lower--;
Line 32, "of" (first occurrence) should read --of the--; and
Line 38, "on-and" should read -- on-and- --.

<u>COLUMN 9</u>:

Line 8, "showing" should read --shown--.

UNITED STATES PATENT AND TRADEMARK OFFICE
CERTIFICATE OF CORRECTION

PATENT NO. : 7,394,101 B2
APPLICATION NO. : 11/297414
DATED : July 1, 2008
INVENTOR(S) : Minoru Watanabe et al.

It is certified that error appears in the above-identified patent and that said Letters Patent is hereby corrected as shown below:

COLUMN 10:

Line 23, "gates" should read --gate--;
Line 38, "of gate" should read --of the gate--; and
Line 41, "between" should read --between a--.

Signed and Sealed this

Twenty-third Day of December, 2008

JON W. DUDAS
*Director of the United States Patent and Trademark Office*